United States Patent

Geels et al.

[11] Patent Number: 5,799,028
[45] Date of Patent: Aug. 25, 1998

[54] PASSIVATION AND PROTECTION OF A SEMICONDUCTOR SURFACE

[75] Inventors: Randall S. Geels, San Jose; Julian S. Osinski, Palo Alto; David F. Welch, Menlo Park; Donald R. Scifres, San Jose, all of Calif.

[73] Assignee: SDL, Inc., San Jose, Calif.

[21] Appl. No.: 683,495

[22] Filed: Jul. 18, 1996

[51] Int. Cl.$^6$ ........................ H01S 3/19
[52] U.S. Cl. ........................ 372/49
[58] Field of Search ........................ 372/49

[56] References Cited

U.S. PATENT DOCUMENTS

| | | | |
|---|---|---|---|
| 4,811,077 | 3/1989 | Fowler et al. | 357/52 |
| 5,208,468 | 5/1993 | Kawanishi et al. | 257/98 |
| 5,228,047 | 7/1993 | Matsumoto et al. | 372/45 |
| 5,260,231 | 11/1993 | Kawanishi et al. | 437/129 |
| 5,491,711 | 2/1996 | Mand et al. | 372/49 |

OTHER PUBLICATIONS

C. J. Sandroff et al., "Dramatic Enhancement in the Gain of a GaAs/AlGaAs Heterostructure Bipolar Transistor by Surface Chemical Passivation", Applied Physics Letters, vol. 51(1), pp. 33–35, Jul. 6, 1987.

E. Yablonovitch et al. "Nearly Ideal Electronic Properties of Sulfide Coated GaAs Surfaces", Applied Physics Letters, vol. 51(6), pp. 439–441, Aug. 10, 1987.

M. S. Carpenter et al., "Effects of $Na_2S$ and $(NH_4)_2S$ Edge Passivation Treatments on the Dark Current–Voltage Characteristics of GaAs pn Diodes", Applied Physics Letters, vol. 52 pp. 2157–2159, Jun., 1988.

M. G. Mauk et al., "Study of Novel Chemical Surface Passivation Techniques on GaAs pn Junction Solar Cells", Applied Physics Letters, vol. 54(3), pp. 213–215, Jan. 16, 1989.

H. H. Lee et al., "Surface Passivation of GaAs", Applied Physics Letters, vol. 54(8), pp. 724–726, Feb. 20, 1989.

Jong–Lam Lee et al., "Evidence for the Passivation Effect in $(NH_4)_2S_x$–Treated GaAs Observed by Slow Positrons" Applied Physics Letters, vol. 58(11), pp. 1167–1169, Mar. 18, 1991.

Yu. V. Medvedev, "Thermodynamic Stability of GaAs Sulfur Passivation", Applied Physics Letters, vol. 64(25), pp. 3458–3460, Jun. 20, 1994.

J. I. Pankove et al., "Passivation of GaAs Surfaces", Journal of Electronic Materials, vol. 12(2), pp. 359–370, 1983 (No Month).

A. V. Syrbu et al., "ZnSe–Facet–Passivated InGaAs/InGaAsP/InGaP Diode Lasers of High CW Power and 'Wall-plug' Efficiency", Electronics Letters, vol. 32(4), pp. 352–354, Feb. 15, 1996.

*Primary Examiner*—James W. Davie
*Attorney, Agent, or Firm*—W. Douglas Carothers, Jr.

[57] ABSTRACT

A surface of a compound III–V semiconductor device is passivated and protected, respectively, by treatment with a sulfur-containing or selenium-containing passivation film on the surface followed by the deposit of a GaN, GaP, InGaP, GaAsP, ZnS or ZnSe protection layer. Prior to passivation and deposition of the protective layer, previously formed contact metalizations may be protected with a liftoff film or layer. A low temperature MOCVD process is used to deposit the protection layer so that the integrity of the previously deposited contact metalization is maintained. The preferred range for MOCVD deposition of the protection layer is in the range of about 300° C. to about 450° C. This processing temperature range is within a temperature range where stable contact metalization exists.

23 Claims, 1 Drawing Sheet

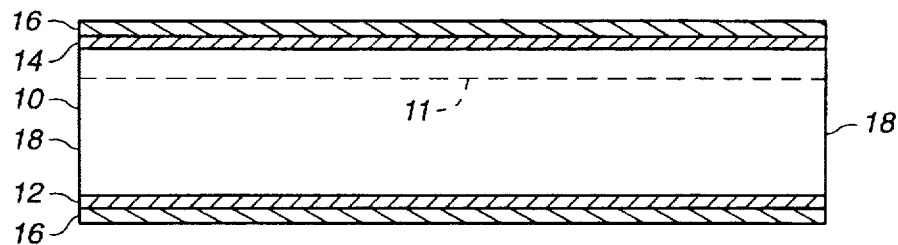
FIG._1
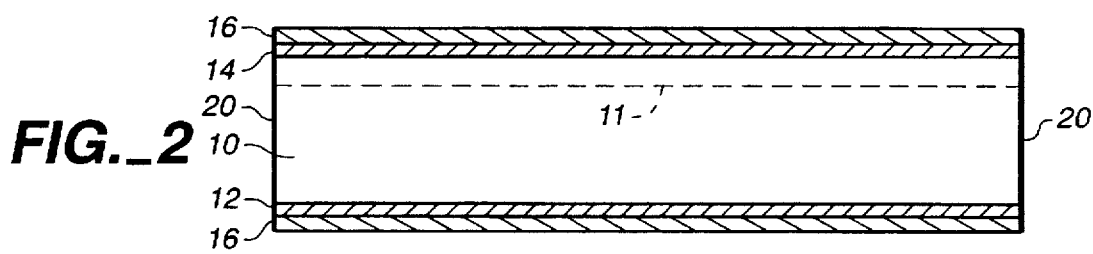
FIG._2
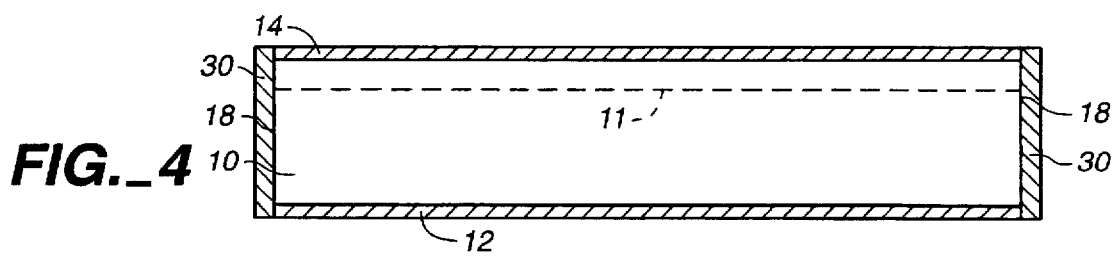
FIG._4
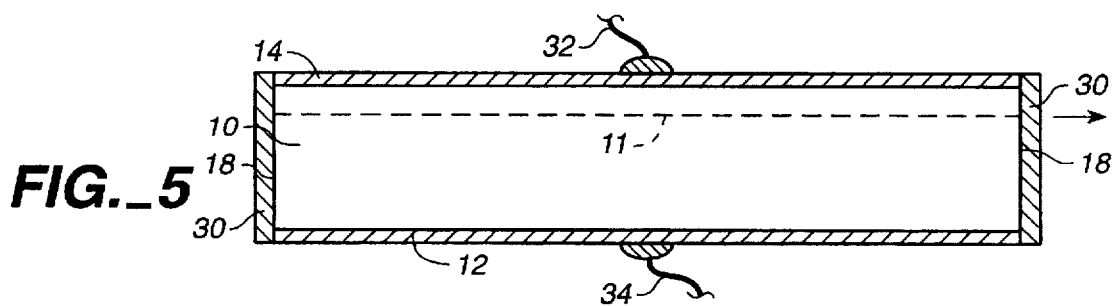
FIG._5
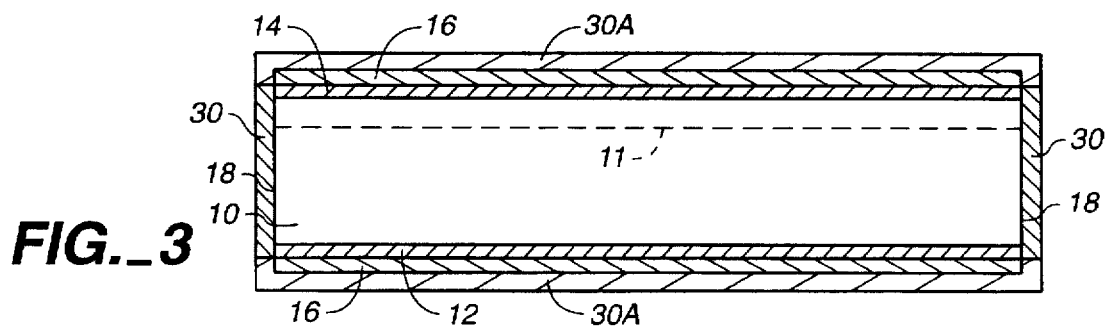
FIG._3

PASSIVATION AND PROTECTION OF A SEMICONDUCTOR SURFACE

This invention was made with government support under Contract No. DMI-9461938, awarded by the National Science Foundation. The government has certain rights in the invention.

FIELD OF THE INVENTION

This invention relates generally to the passivation of a surface and has particular reference to passivation of semiconductor device surface, e.g., laser diode or other optical semiconductor device facet passivation, although the techniques disclosed may readily be employed in the passivation of any semiconductor surface, particularly in cases where a metal contact layer is present and its integrity requires preservation during subsequent semiconductor surface treatment.

BACKGROUND OF THE INVENTION

The use of laser diodes has come in prominent use in optical disc storage units and optical telecommunications requiring long term reliability. One of the primary causes of laser diode failure in the field is low catastrophic optical damage (COD) levels due to enhanced light absorption at the facet or defect creation and migration at the laser facet surface. The general treatment in the past has been to utilize III–V materials at the facet surface which are lattice matched with the internal crystal structure and have a wider bandgap than the active layer. As an example, in U.S. Pat. No. 5,491,711, there is disclosed an InGaAs/GaAs active region with a thin facet layer of aluminum or phosphorus that converts the near-surface material to a wider bandgap. Another example is U.S. Pat. No. 5,228,047 disclosing a facet window structure comprising AlGaAs or InGaAlP or their combination having a sufficient thickness of 0.2 nm to 3 μm to prevent local generation of crystal defects by lattice mismatching between the window layer and the laser device. Further, a protective layer may be formed over the window layer having a bandgap different from that of the window layer. U.S. Pat. No. 5,228,047 teaches the use of a sulfur-containing layer on the facet as a protection layer.

The teaching of the use of sulfur-containing materials to passivate and protect the laser facet has become prevalent. In U.S. Pat. Nos. 5,260,231 and 5,208,468, a sulfur-containing film is formed with a sulfur-containing solution, e.g., undiluted $(NH_4)_2S$ solutions, aqueous $(NH_4)_2S$ solutions, undiluted $(NH_4)_2S_x$ solutions or aqueous $(NH_4)_2S_x$ solutions, on the facet surface of an AlGaAs semiconductor laser to remove surface oxygen, followed by the electron beam evaporation of a protective film, such as $Si_3N_4$, AlN, C, $MgF_2$, $CaF_2$, NaF, ZnS or ZnSe. Other examples are U.S. Pat. No. 5,451,542 relating to a photo-sulfidation process using ultraviolet light and sulfur vapor to remove native oxide from a III–V surface. U.S. Pat. No. 4,751,200 passivates a III–V surface to reduce surface recombination velocity using a spin-on solution of sodium sulfide. U.S. Pat. No. 5,300,320 passivates III–V substrate surfaces using a MOCVD precursor to form a film where the precursor is a butyl group plus GaS or AlS or GaSe or GaTe. U.S. Pat. No. 5,116,767 teaches the deposit of sulfide films on InGaAsP lasers to passivate defects on the laser facets.

U.S. Pat. No. 4,811,077 discloses the passivation relative to the improvement of surface carrier recombination at III–V compound semiconductor surfaces using a combination of very thin layers. In the preferred embodiment, a pinning control monolayer (i.e., prevention of pinning or unpinning of the Fermi level) of GaS is deposited, followed by a 1 nm to 1,000 nm dielectric, ambient inert, dielectric, translucent protective layer of $SiO_2$ deposited by PECVD, although other deposited protective layers are suggested, such as $CaF_2$, NaS, ZnS, GaP, GaSe and polyimides. However, nothing is disclosed or taught as to how these layers may affect optical properties or relate to facet preservation or how they may be applied in the presence of previously deposited metal layers.

It is, therefore, an object of this invention to provide an optical semiconductor device with improved reliability.

It is another object of this invention to provide improved surface passivation of an optical semiconductor device with decreased surface recombination velocity.

Another object of this invention is to provide semiconductor laser diode devices that have a higher catastrophic optical damage level compared to prior semiconductor laser diode devices.

SUMMARY OF THE INVENTION

According to this invention, a surface of an optical semiconductor device is passivated and protected, respectively, by the treatment with a sulfur-containing or selenium-containing material on the surface to be treated to reduce surface recombination velocity, followed by the deposit of a GaN, GaP, InGaP, GaAsP, ZnS or ZnSe layer to seal indefinitely the surface from oxidation and other environmental contaminants. The preferred embodiment is a GaP or InGaP protection layer, although the other stated materials as protection layers are equally suitable. In a particular example, the facet of a III–V semiconductor laser or amplifier device may be treated by, first, forming a sacrificial layer on any metal contact layers that may be present to protect them from the passivation process, second, contacting a sulfur-containing solution to the surfaces to be treated, e.g., involving a monolayer or less of sulfur, to chemically displace native and other oxides from the surface through formation of chemical bonds with oxygen atoms as well as chemically react with free elemental As to remove it from the surface, and, third, forming a thin overlayer or protective layer of GaN, GaP, InGaP, GaAsP, ZnS or ZnSe on the passivation layer. Sulfur-containing treatment does passivate III–V surfaces but the passivation is subject to attack over time by environmental oxygen and other contaminants so that an additional protection layer is highly preferred to prevent any such contamination that results in reduced surface integrity. However, in the presence of previously deposited metal contact layers for the device, subsequent high temperature processing must be kept in check to prevent contamination, melting or diffusion of the metal layers into surrounding semiconductor materials. This is accomplished by employing a low temperature chemical vapor deposition, e.g., MOCVD process for the deposition of the GaN, GaP, InGaP, GaAsP, ZnS or ZnSe protection layer which does not destroy the integrity or ohmic contact characteristics of the metal contact layers. In the case of a GaP protection layer, for example, this compound material is of higher bandgap than active regions of AlGaAs or AlGaInP so as to be transparent to the propagating light emitted by the laser diode device. In the case of an InGaP protection layer, this compound material is of higher bandgap than the active region of AlGaInP so as to be transparent to the propagating light emitted by the laser diode device. The preferred range for MOCVD deposition of the protection layer is in the range of about 300° C. to about 450° C.

This processing temperature range is within a temperature range where stable contact metalization exists.

Other objects and attainments together with a fuller understanding of the invention will become apparent and appreciated by referring to the following description and claims taken in conjunction with the accompanying drawings.

BRIEF DESCRIPTION OF THE DRAWINGS

FIG. 1 is a schematic cross-section view of a step according to this invention in the application of a sacrificial layer on an optical semiconductor device.

FIG. 2 is a schematic cross-section view of a step according to this invention in the application of a passivation layer on an optical semiconductor device.

FIG. 3 is a schematic cross-section view of a step according to this invention in the application of a protection layer on an optical semiconductor device.

FIG. 4 is a schematic cross-section view of a step according to this invention in the application of a lift-off step on an optical semiconductor device.

FIG. 5 is a schematic cross-section view of the finished an optical semiconductor device.

DETAILED DESCRIPTION OF THE PREFERRED EMBODIMENTS OF THE INVENTION

Reference is now made to the process of forming passivation and protection coatings on semiconductor surfaces that require passivation either for purposes of optoelectronic property protection. The examples are to passivation and protection of the facet surfaces of an optical semiconductor device to reduce surface recombination velocity, to increase its catastrophic optical damage level and to protect the facet from degradation due to environmental exposure, i.e., passivating and sealing the surface to future oxidation. For purpose of explanation here, reference is made to an optical semiconductor device comprising a semiconductor lase diode device having at least one facet. Other such devices are optical semiconductor filters and semiconductor amplifiers, modulators and absorbers.

It should be noted that there are some processes for the manufacture of optical semiconductor devices where, during fabrication remain in the wafer configuration with end facets formed through wafer microcleaving, etching or other such process for the discretely formed devices in the wafer without dicing and without the application of a metal contact layer. This invention as related to passivation and protective layer application is also applicable to these processed wafers.

The process and resulting structure according to this invention begins with the completion of wafer processing of III–V wafer comprising a plurality of layers of III–V compound materials grown by epitaxial growth methods, such as, but not limited to, liquid phase epitaxy, molecular beam epitaxy and metalorganic chemical vapor deposition (MOCVD). FIG. 1 shows one individual laser die or bar cleaved from such a wafer comprising laser diode 10 with cleaved end facets 18 and having active region 11 for generating light under lasing conditions when a voltage is applied between ohmic metal contacts 12 and 14. For example, laser diode 10 may be a AlGaAs based laser or an InGaAlP based laser.

After completion of the growth of the last layer on the III–V wafer, which is generally a cap layer, e.g., p$^+$ GaAs, conventional metal contact layers 12 and 14 are formed respectively on the bottom and top surfaces of the wafer to form ohmic contacts for individual laser diode devices produced upon breaking up of the grown wafer into individual laser die or bars such as shown in FIG. 1. Next, and prior to wafer dicing, a thin sacrificial layer 16 is formed over both contact layers 12 and 14 using conventional CVD, evaporation, sputtering or other similar process. The sacrificial layer may be comprised of any suitable material, metal or dielectric, that can be selectively removable from underlying device layers without damage and the device facet is not damaged by its application or removal and can withstand processing temperatures required for the subsequently deposited protection layer, which can be as high as 450° C., and which can be easily lifted off with an acid, e.g., HCl. Also, sacrificial layers 16 protect the metal surfaces of laser diode 10 from the facet deposition process which, if exposed, may compromise the quality of those surfaces upon subsequent soldering and bonding. Examples of compound materials suitable for sacrificial layers 16 are $Si_3N_4$, $MgF_2$, $Al_2O_3$, $SiO_2$, Al, Ti or Ni, although there are many other compound oxides and other possible metals that may be utilized in the successful practice of this invention. The thickness of sacrificial layers 16 should be sufficient to permit clean liftoff and, generally, may be in the range of about 500 Å up to about 1 μm. Upon completion of the deposition of sacrificial layers 16, the wafer is cleaved into individual die comprising laser diodes 10 for further processing in accordance with this invention.

The next steps of the process deal with the cleaning of the surfaces to be treated of native and other oxides to provide contamination-free surfaces for passivating and sealing the surface. To obtain a clean contamination-free surface, the facet surfaces 18 are treated with a sulfur-containing solution or selenium-containing medium 20 to passivate facet surfaces 18, as depicted in FIG. 2. Then, a protective film 30 is formed on the treated surface, indicated at 20, as shown in FIGS. 3 and 4, which is discussed in further detail later. Surface passivation using sulfur, selenium and other elemental treatments was first discussed as far back as 1987 and is disclosed and discussed in U.S. Pat. No. 5,260,231, with the earlier published articles being of C. J. Sandroff et al., entitled "Dramatic Enhancement in the Gain of a GaAs/AlGaAs Heterostructure Bipolar Transistor by Surface Chemical Passivation", Applied Physics Letters, Vol. 51(1), pp. 33–35, Jul. 6, 1987; E. Yablonovitch et al. entitled "Nearly Ideal Electronic Properties of Sulfide Coated GaAs Surfaces", Applied Physics Letters, Vol. 51(6), pp. 439–441, Aug. 10, 1987; M. S. Carpenter et al., entitled "Effects of $Na_2S$ and $(NH_4)_2S$ Edge Passivation Treatments on the Dark Current-Voltage Characteristics of GaAs pn Diodes", Applied Physics Letters, Vol. 52 pp. 2157–2159, June, 1988; and M. G. Mauk et al., entitled "Study of Novel Chemical Surface Passivation Techniques on GaAs pn Junction Solar cells", Applied Physics Letters, Vol. 54(3), pp. 213–215, Jan. 16, 1989, and other published articles being articles of H. H. Lee et al., entitled "Surface Passivation of GaAs", Applied Physics Letters, Vol. 54(8), pp. 724–726, Feb. 20, 1989; Jong-Lam Lee et al., entitled "Evidence for the Passivation Effect in $(NH_4)_2S_x$-Treated GaAs Observed by Slow Positrons" Applied Physics Letters, Vol. 58(11), pp. 1167–1169, Mar. 18, 1991; and Yu. V. Medvedev, entitled "Thermodynamic Stability of GaAs Sulfur Passivation", Applied Physics Letters, Vol. 64(25), pp. 3458–3460, Jun. 20, 1994, which are all incorporated herein by their reference. The application of sulfur to GaAs, AlGaAs or other III–V compound materials is effective in reducing surface recombination velocity and improving device performance. Since surface recombination velocity is instrumental in the degradation of laser diode facets, the passivation of laser facets 18 improves surface quality and significantly decreasing the surface recombination velocity.

The passivation and reduction of surface recombination velocity in III–V compound materials, e.g., GaAs or AlGaAs or AlGaInP, with the application of a sulfide material, such as $(NH_4)_2S$, is believed to occur as a result of removing surface or native oxides, such as $As_2O_3$, $Ga_2O_3$ and $Al_2O_3$, and replacing these oxides with sulfur (See E. Yablonovitch et al., supra). The presence of these oxides together with free As are believed to cause the creation of mid-gap states usually found on GaAs surfaces (See M. S. Carpenter et al., supra). The basic pH of a $(NH_4)_2S$ solution facilitates removal of $As_2O_3$, $Ga_2O_3$ and $Al_2O_3$ and the sulfide ions in the sulfide treatment solution will chemically react with free, elemental As and also remove it into solution. As a result, the surface resulting from exposure to the sulfide solution is characterized by freedom from oxides and As and is terminated with sulfur resulting in a very low surface recombination velocity. The chemical reactions occurring at the surface of AlGaAs or AlGaInP are similar to those in GaAs by virtue of the fact that these materials are all III–V semiconductor compounds.

Another passivation treatment that may be utilized in the practice of this invention is CVD deposition of an ultra thin (e.g., one or more monolayers) selenium passivation treatment indicated at 20. In practice, individual diodes 10 are placed in a conventional vertical MOCVD reactor on a susceptor upon completion of the formation of the sacrificial layer deposition and the cleaving of the diodes from the wafer. The temperature of the reactor is increased to about 400° C. (or to a temperature within the range of about 350° C. to about 450° C.). Next, a gas comprising $H_2Se$ is fed into the MOCVD chamber for a sufficient period of time (e.g., about 10 minutes) to passivate the facet surfaces and chemically displace any surface oxides with a selenium treatment at 20. This is followed, without removal of the diode devices from the MOCVD reactor, by the deposition of a protection layer, such as GaP or InGaP, explained in greater detail below.

It connection with the facet surface passivation employing $H_2Se$ in an MOCVD reactor, it should be realized that a sulfur treatment can also be conducted using an MOCVD reactor employed for depositing the sulfur film on the diode facets rather than employing a sulfur containing solution treatment suggested above and disclosed in U.S. Pat. No. 5,260,231 and the articles of M. S. Carpenter et al. and E. Yablonovitch et al. This approach of forming a MOCVD passivation treatment surface 20 has the distinct advantage of providing a passivation step that can be carried out in conjunction with the deposition of the subsequent protection layer 30, both accomplished in a continuous manner within the same reactor.

While the passivation of facet surfaces with a sulfur treatment in and of itself is not new, this treatment lacks the impermeability desired for long term application and use of the semiconductor device. For example, upon subsequent processing, usually involving further elevated temperature processing, after the sulfur passivation treatment, any elemental sulfur remaining on the facet surfaces will readily dissipate as $H_2S$. In any case, the beneficial effects of sulfur film treatment degrade with time so that the film becomes sufficiently weakened to be susceptible to penetration of moisture and re-oxidation of the facet surface occurs. In order to prevent this reoxidation of the facet surface, a thin protection layer 30 comprising a more permanent passivating film is applied to the passivation treated surface 20. The protection film 30 may be a layer of GaN, GaP, InGaP, GaAsP, ZnS or ZnSe deposited using MOCVD at a temperature below which degradation of a previously formed metalization layer does not occur. For the above materials, the preferred low temperature deposition is about 450° C. or below. The dual step process to be carried out in the practice of this invention is, therefore, a first passivation step to passivate the facet surfaces and chemically react with the facet surface and displace any oxides inevitably present on the facets and a second protection step of sealing or otherwise encapsulating the laser facet with a more permanent protection. Protection layer 30 has a higher bandgap than the III–V compound materials present at facets 18 of laser diode 10, such as GaAs, AlGaAs or AlGaInP. These materials are, therefore, optically transparent to the emitting radiation, and these materials will form an electrical heterojunction to keep carriers away from the facet surfaces.

As indicated above, protection layer 30 may be applied to end facet surfaces 18 by means of MOCVD. For example, GaP may be deposited using a MOCVD reactor at a relatively low deposition temperature, such as in the range of about 300° C. to about 450° C., e.g., at about 400° C. A good deposition temperature deposition for InGaP in this range is about 420° C. It is important that the facet protection layer 30 be carried out at a sufficiently low temperature since low temperature deposition prevents degradation of the metal contacts present on laser diode 10. Thus, the processing temperatures involved must be within a temperature range where the contact metalizations remain stable, e.g., do not melt or interdiffuse with underlying III–V layer material. Also, it is important to insure layer 30 is sufficiently thick to permanently seal the facet surface but not so thick as to prevent the penetration of an etchant to bring about dissolving and liftoff of adjacent sacrificial layers 16 and their corresponding overlying, deposited passivation and protection films to expose the underlying and uncontaminated metal contacts 12 and 14.

Protection layer 30 may be several 100 Å thick, e.g., 100 Å to 500 Å. The upper limit is effected by a thickness sufficient to prevent penetration of an etchant in lift-off process of removing the sacrificial film or layer 16, to be described later in more detail as well as the formation of defects due to the lattice mismatch with the crystal laser structure 10.

With the deposit of protection layers 30, as indicated in FIG. 3, laser diode 10 is removed from the MOCVD reactor and a liftoff process is initiated to remove sacrificial layers 16 together with their overlying portions of deposited films 30A. The etchant employed for the liftoff step dissolves and lifts off the sacrificial layers 16 but is ineffective in etching films 20 and 30. The etchant can permeate thin layer portions 30A because the deposition on the liftoff layers 16 is substantially polycrystalline so that there are may voids, cracks, fissures in layer portions 30A, rendering it very porous, compared to crystalline deposited layers 30 which form on end surfaces of single crystal grown material. Due to the porous nature of layer portions 30A, the etchant is effective on underlying layers 16 permitting its dissolution and removal with overlying film portions 30A leaving crystalline deposited protection films 30 at end facets 18 intact. Examples of appropriate etchants are diluted solutions of HF or HCl. The resulting device 10, upon removal of sacrificial layers 16 is shown in FIG. 4. After this layer removal, device 10 is wire bonded at 32 and 34, as shown in FIG. 5, and tested for operation and burn-in.

The following specific examples are given to illustrate the process according to this invention but, as is readily apparent to those skilled in the art, the process as described in this disclosure is not limited to these examples.

EXAMPLE 1

A processed AlGaInP/GaAs wafer with deposited metal films for contact metalization on both major surfaces was next coated on both major surfaces with a sacrificial layer of $SiO_2$ employing conventional CVD. The thickness of the deposited $SiO_2$ film was about 1500 Å. Next, the wafer was cleaved into laser diodes or bars and the bars were soaked in a solution of $(NH_4)_2S$ for 2 minutes, after which the bars were rinsed and dried, forming an ultra-thin sulfur coating on the facet surfaces that chemically displaced the surface oxides. The sulfur coating was estimated to be no more than a monolayer in thickness. Next, the bars were placed on a susceptor in a conventional MOCVD reactor. The temperature of the reactor was then raised to about 400° C. and maintained. Trimethylgallium and phosphine were introduced in the MOCVD chamber and a layer of crystalline GaP was deposited on the end facets of the laser bars having a layer thickness of about 200 Å. The laser bars were then removed from the reactor and placed in a dilute solution of HF for approximately 1 to 2 minutes removing the $SiO_2$ layers and their overlying GaP polycrystalline film portions, exposing clean metal contact surfaces.

The processing of the laser bars was completed by applying mirror coatings on the protected facet surfaces followed by wire bonding to the metal contacts forming single mode, AlGaInP/GaAs laser diodes with an operating wavelength of about 635 nm. The devices were then tested and compared to standard devices made without the facet GaP protection layer. Tests were conducted through operation of protected facet laser devices for over 100 hours at room temperature at 30 mW output and for over 20 hours at 50° C. at 30 mW output. None of the devices experienced any failure. Unprotected facet laser devices of the same type rated at 15 mW output could not achieve these same total hours of operation at room temperature and at 50° C. without experiencing in many cases catastrophic failure.

EXAMPLE 2

The same as Example 1 except that, instead of soaking the bars in a $(NH_4)_2S$ solution, the bars are placed on a susceptor in a conventional MOCVD reactor. The temperature of the reactor is raised to about 400° C. and maintained. Next, $H_2Se$ is introduced into the reactor, and a deposited layer of selenium is formed on the laser bar facets displacing the surface oxides and a monolayer of selenium thickness is formed on the facet surfaces. Then, without removal of the laser bar facets from the reactor, trimethylgallium and phosphine were introduced in the MOCVD chamber and a crystalline layer of GaP is deposited on the end facets of the laser bars having a layer thickness of about 200 Å. The laser bars are then removed from the reactor and placed in a dilute solution of HF for approximately 1 to 2 minutes removing the $SiO_2$ layers and their overlying polycrystalline GaP film portions, exposing clean metal contact surfaces.

Although the invention has been described in conjunction with one or more preferred embodiments, it will be apparent to those skilled in the art that other alternatives, variations and modifications will be apparent in light of the foregoing description as being within the spirit and scope of the invention. Thus, the invention described herein is intended to embrace all such alternatives, variations and modifications as that are within the spirit and scope of the following claims.

What is claimed is:

1. An optical semiconductor device comprising:
   a plurality of Group III–V semiconductor layers formed on a Group III–V substrate having opposite major surfaces and having at least one end facet for light emission;
   metal contacts formed on said opposite major surfaces;
   a coating formed on said one end facet, said coating comprising a first passivating layer with a sulfur or selenium medium and a second protection layer comprising a Group III–V compound transparent to said light emission, said second protection layer deposited at a temperature that prevents degradation of said metal contacts.

2. The optical semiconductor device of claim 1 wherein said second protection layer comprises GaN, GaP, InGaP or GaAsP.

3. The optical semiconductor device of claim 2 wherein said device includes an active region comprising GaAs, AlGaAs, InGaP, InGaAs, or AlGaInP.

4. The optical semiconductor device of claim 1 wherein said second protection layer is several hundred Angstroms thick.

5. The optical semiconductor device of claim 4 wherein said second protection layer has a thickness in the range of about 100 Å to about 500 Å.

6. The optical semiconductor device of claim 1 wherein said metal contacts are each covered with a sacrificial layer prior to formation of said coating to protect said metal contacts from contamination by said coating.

7. The optical semiconductor device of claim 6 wherein said second protection layer is sufficiently thick to seal said end facet from the environment but is not so thick as to prevent penetration of an etchant for later removal of said sacrificial layers.

8. The optical semiconductor device of claim 7 wherein said second protection layer is several hundred Angstroms thick.

9. The optical semiconductor device of claim 1 wherein said second protection layer is deposited at a deposition temperature below about 450° C.

10. The optical semiconductor device of claim 9 wherein said deposition temperature is within the range of about 300° C. to about 450° C.

11. The optical semiconductor device of claim 9 wherein said deposition is accomplished by low temperature MOCVD.

12. An optical semiconductor device comprising:
    a plurality of Group III–V semiconductor layers formed on a Group III–V substrate having opposite major surfaces and having at least one end facet for light emission;
    a coating formed on said one end facet, said coating comprising a first passivating layer with a sulfur containing medium and a second protection layer comprising a Group III–V compound transparent to said light emission deposited at a low temperature to prevent degradation of said device; and
    a sacrificial layer formed on each of said device major surfaces prior to formation of said coating; said sacrificial layers subsequently removed after formation of said coating.

13. The optical semiconductor device of claim 12 further comprising metal contacts formed on said opposite major surfaces prior to the formation of said sacrificial layers to protect said metal contacts from contamination by said coating.

14. The optical semiconductor device of claim 12 wherein said second protection layer comprises GaN, GaP, InGaP or GaAsP.

15. The optical semiconductor device of claim 14 wherein said device includes an active region comprising GaAs, AlGaAs, InGaP, InGaAs, or AlGaInP.

16. The optical semiconductor device of claim 12 wherein said second protection layer is several hundred Angstroms thick.

17. The optical semiconductor device of claim 16 wherein said second protection layer has a thickness in the range of about 100 Å to about 500 Å.

18. The optical semiconductor device of claim 12 wherein said second protection layer is sufficiently thick to provide a permanent seal of said end facet but is not so thick as to prevent penetration of an etchant for later removal of said sacrificial layers.

19. The optical semiconductor device of claim 18 wherein said second protection layer is several hundred Angstroms thick.

20. The optical semiconductor device of claim 12 wherein said second protection layer is deposited at a deposition temperature below about 450° C.

21. The optical semiconductor device of claim 20 wherein said deposition temperature is within the range of about 300° C. to about 450° C.

22. The optical semiconductor device of claim 20 wherein said deposition is accomplished by low temperature MOCVD.

23. The optical semiconductor device of claim 12 wherein said sacrificial layers comprise of $Si_3N_4$, $MgF_2$, $Al_2O_3$, $SiO_2$, Al, Ti or Ni.

* * * * *